United States Patent
Pineda De Gyvez et al.

(10) Patent No.: US 7,539,589 B2
(45) Date of Patent: May 26, 2009

(54) TESTING RADIO FREQUENCY AND ANALOGUE CIRCUITS

(75) Inventors: Jose De Jesus Pineda De Gyvez, Eindhoven (NL); Alexander Guido Gronthoud, Eindhoven (NL); Rachid Amine, Béni-Mellal (MA)

(73) Assignee: NXP B.V., Eindhoven (NL)

( * ) Notice: Subject to any disclaimer, the term of this patent is extended or adjusted under 35 U.S.C. 154(b) by 118 days.

(21) Appl. No.: 10/561,451

(22) PCT Filed: Jun. 17, 2004

(86) PCT No.: PCT/IB2004/050932

§ 371 (c)(1),
(2), (4) Date: Dec. 20, 2005

(87) PCT Pub. No.: WO2004/113940

PCT Pub. Date: Dec. 29, 2004

(65) Prior Publication Data

US 2007/0143643 A1    Jun. 21, 2007

(30) Foreign Application Priority Data

Jun. 24, 2003    (EP) .................................. 03291557

(51) Int. Cl.
*G01R 31/00* (2006.01)
(52) U.S. Cl. ..................................................... 702/117
(58) Field of Classification Search .................... 702/57, 702/58, 64, 71, 90, 117–119, 123, 182, 183, 702/185, 193; 324/158.1, 765
See application file for complete search history.

(56) References Cited

U.S. PATENT DOCUMENTS

| | | | |
|---|---|---|---|
| 5,592,077 A * | 1/1997 | Runas et al. | 324/158.1 |
| 5,923,601 A * | 7/1999 | Wendell | 365/201 |
| 6,714,032 B1 * | 3/2004 | Reynick | 324/765 |
| 6,891,389 B1 * | 5/2005 | Walker et al. | 324/763 |
| 7,109,558 B2 * | 9/2006 | Nakano et al. | 257/401 |
| 2002/0145138 A1 * | 10/2002 | Ishibashi | 257/48 |
| 2003/0085729 A1 * | 5/2003 | Binkley et al. | 324/765 |
| 2006/0158222 A1 * | 7/2006 | Gattiker et al. | 326/82 |

* cited by examiner

*Primary Examiner*—Edward Raymond
*Assistant Examiner*—Mohamed Charioui

(57) ABSTRACT

A method and apparatus for testing analogue or RF circuitry, wherein the power supply VDD is ramped up (step 100) and quiescent current measurements are taken at selected values of VDD (step 102) to generate a current signature (step 104). When the power supply is ramped up, all transistors in the circuit pass through several regions of operation, e.g. sub-threshold (region A), linear (region B), and saturation (region C). The advantage of transition from region to region is that defects can be detected with distinct accuracy in each of the operating regions. Once the current signature has been generated it can be compared with the current signature of a fault-free device (step 106), to determine (step 108) if the device is operating correctly, and if not, it is discarded.

11 Claims, 3 Drawing Sheets

TESTING RADIO FREQUENCY AND ANALOGUE CIRCUITS

This invention relates generally to testing analogue and radio frequency components and circuits and, more particularly, to a method and apparatus for detecting the presence of faults in a radio frequency (RF) or analogue component or circuit at low frequencies, namely DC.

Integrated circuits (ICs) have become key components of many consumer and commercial electronic products, often replacing discrete components and enhancing product functionality. The semiconductor processing technologies that produce these integrated circuits have advanced to the point where complete systems can often be reduced to a single integrated circuit. These integrated circuits, or "chips", may use many functions that previously could not be implemented together on a single chip, including: microprocessors, digital signal processors, mixed signal and analogue functions, large blocks of memory, high speed interfaces, and RF circuits.

It is common practice for manufacturers of such integrated circuits to thoroughly test device functionality at the manufacturing site. However, the complex nature of today's integrated circuits presents new testing challenges. Continually shrinking device geometries, coupled with the high cost of operating semiconductor processing equipment, result in increased demand on integrated circuit suppliers to improve process yields and develop new test strategies.

Currently, complementary metal-oxide-semiconductor (CMOS) is the most popular technology for fabricating integrated circuits due to its inherent low power consumption in high density designs. CMOS circuits use complementary p-channel metal-oxide-semiconductor field-effect (PMOS) transistors and n-channel metal-oxide-semiconductor (NMOS) transistors to produce fully static designs that ideally consume no power except when switching states. In practice, however, CMOS circuits draw low leakage or quiescent currents—also referred to as quiescent power supply current or IDDQ—in a static state. Testing the amount of quiescent current consumed by an integrated circuit provides a relatively simple and cost effective test strategy for screening for physical defects, many of which cause a measurable increase in quiescent current consumption.

U.S. Pat. No. 6,239,609 describes a method of testing an integrated circuit wherein, initially, the device under test is placed into a static DC state, and quiescent current is then measured with the power supply to the device set to a nominal operating voltage. Next, a fixed voltage lower than the nominal power supply voltage is applied to the integrated circuit in order to reduce the quiescent current consumed by its transistors. An additional quiescent current measurement is taken, and the difference in quiescent current between the first and second measurements is calculated. Additional quiescent current measurement(s) are also taken at increasingly lower supply voltages and the differences between each of these measurements are calculated. After a sufficient number of measurements have been gathered, the resulting difference values are examined to determine the "linearity" of the quiescent current reduction. In an acceptable device, the lower power supply voltages cause the leakage or quiescent current inherent in the integrated circuit to decrease in a roughly exponential manner. Therefore, if the reduction in quiescent current is roughly exponential, it is generally assumed that the detected quiescent currents are a result of normal transistor effects. If the change in currents approximates a linear function, however, it is likely that the device under test contains a defect and the device is rejected.

However, the exponential behavior of leakage or quiescent currents is typical of digital integrated circuits, such that the above-described method is not particularly well suited to the testing of analogue or RF circuits and components.

Testing is becoming a substantial barrier to continued analogue and RF IC cost reduction because of the additional complexities required by new standards, including multi-band compatibility, higher linearity, lower bit error rate, and long battery life. Current test practices for these types of devices are expensive because, among other reasons, of the required tester infrastructure, long test times, cumbersome test preparation, lack of appropriate defect and fault models, and lack of standardized test methods.

Functional testing is often based on Bit Error Rate testing. Although this test is the ultimate performance indicator for a complete receiver chain, it is by nature a time-consuming, and therefore expensive, test to use.

We have now devised an improved arrangement.

In accordance with the present invention, there is provided a method of testing analogue or radio frequency circuitry for the presence of faults, the method comprising the steps of:
a) applying a plurality of different DC power supply voltages to a circuit or component under test, at least one of said power supply voltages being arranged to cause at least some of the elements of the circuit or component under test to operate in a predetermined region of operation; and
b) measuring the quiescent current of said circuit or component as a result of application of said power supply voltages to generate a current signature representative of the operation of said circuit or component;
   the method being characterized in that said power supply voltages at which said quiescent current measurements are taken comprise selected distinct voltages; and by the step of:
c) comparing said generated current signature with a predetermined current signature representative of operation of a fault-free component or circuit so as to determine whether or not any faults are present in the component or circuit under test.

The invention further extends to a record carrier on which is stored a computer program for enabling the above-defined method to be performed, and to a method of testing analogue or radio frequency circuitry, including the step of making available for downloading a computer program for enabling the above-defined method to be performed.

Also in accordance with the present invention, there is provided apparatus for testing analogue or radio frequency circuitry for the presence of faults, the apparatus comprising:
a) means for applying a plurality of different DC power supply voltages to a circuit or component under test, at least one of said power supply voltages being arranged to cause at least some of the elements of the circuit or component under test to operate in a predetermined region of operation; and
b) means for measuring the quiescent current of said circuit or component as a result of application of said power supply voltages to generate a current signature representative of the operation of said circuit or component;
   the apparatus being characterized in that said power supply voltages comprise selected distinct voltages; and by:
c) means for comparing said generated current signature with a predetermined current signature representative of operation of a fault-free component or circuit so as to determine whether or not any faults are present in the component or circuit under test.

It will be appreciated that the term "current signature" used herein is intended to refer to the curve that shows up in an Idd vs. $V_{DD}$ plot: there is a golden curve when the device is fault-free.

In a preferred embodiment, the method includes the further step of measuring one or more selected nodal voltages, in addition to said quiescent current, as a result of application of said selected power supply voltages.

Beneficially, a single supply voltage means is provided which is beneficially ramped up to attain each of said selected power supply voltages, prior to measurement of the quiescent current. Beneficially, the selected power supply voltages are selected so as to cause at least some of the elements of the circuit or component under test to pass through several regions of operation, for example, subthreshold, linear and saturation.

In one embodiment, a fault dictionary database may be provided, and the method may include the further step of comparing a generated current signature with contents of such a database to diagnose one or more faults present in the circuit or component under test.

Beneficially, a tolerance window is defined for the resultant quiescent current measurements for at least one, and more preferably, all of the selected power supply voltages.

Thus, the present invention provides a method and apparatus for detecting faults in analogue and RF circuitry. The testing is performed at low frequencies, namely DC, instead of testing at very high frequencies, as is the case in many conventional testing methods. The preferred method comprises measurement of the circuitry's quiescent current along with selected nodal voltages for various power supply voltages ($V_{DD}$). Because multiple power supply values are used, it is possible for the majority of elements (i.e. transistors) to be forced into various regions of operation (e.g. subthreshold, linear and saturation). The advantage of this is that the detection of faults is performed in respect of a plurality of supply voltages with corresponding quiescent currents and nodal voltages, thereby enhancing the accuracy of fault detection and fault coverage. In fact, the method and apparatus of the present invention yield fault coverage results comparable to conventional functional RF tests, with additional advantages in terms of its relatively low cost, low testing times and low frequency requirements.

It will be appreciated that the arrangement described in U.S. Pat. No. 6,239,609 measures the quiescent current difference at two consecutive power supply values. If this difference is not exponential the circuit is regarded as faulty in contrast, in an arrangement according to the present invention power supply is swept up, and for each power supply value a tolerance window is defined in which the quiescent current should fit in order to regard the circuit as fault-free. Preferably, the tolerance window is related to process spread. The arrangement of U.S. Pat. No. 6,239,609 would not work for testing analogue circuits. This is because this document assumes that the circuit under test has no DC voltage of the transistors. Thus, in accordance with the present invention, the user is not constrained to the subthreshold regime typical to digital circuits. Furthermore, in the case of the present invention, the user is not constrained to measuring current, nodal voltages at various supply values may also be measured. Still further, in accordance with an exemplary embodiment of the invention, an optimal minimum set of $V_{DD}$ points are selected such that from either current and/or voltage measurements a (at least virtually) 100% fault coverage is attained. These and other aspects of the present invention will be apparent from and elucidated with reference to the embodiment described hereinafter.

An embodiment of the present invention will now be described by way of example only and with reference to the accompanying drawings, in which.

Figure 1:
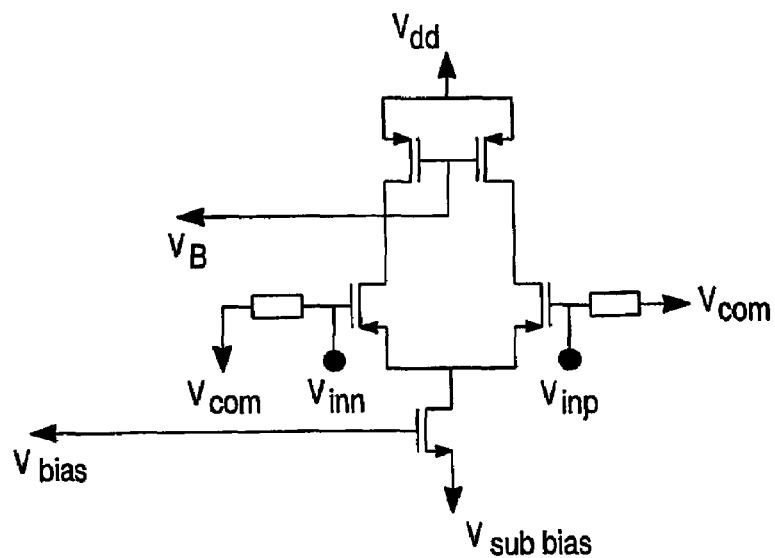
FIG. 1 is a schematic circuit diagram of a low noise amplifier.

Referring to FIG. 1 of the drawings, an exemplary method of testing a low noise amplifier circuit according to the invention will be described.

Figure 2:
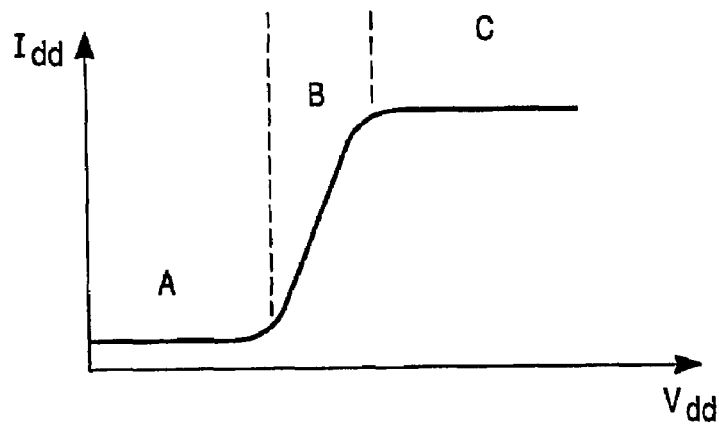
FIG. 2 is a schematic graphical representation of a quiescent current signature obtained in accordance with an exemplary embodiment of the present invention.
Figure 4:
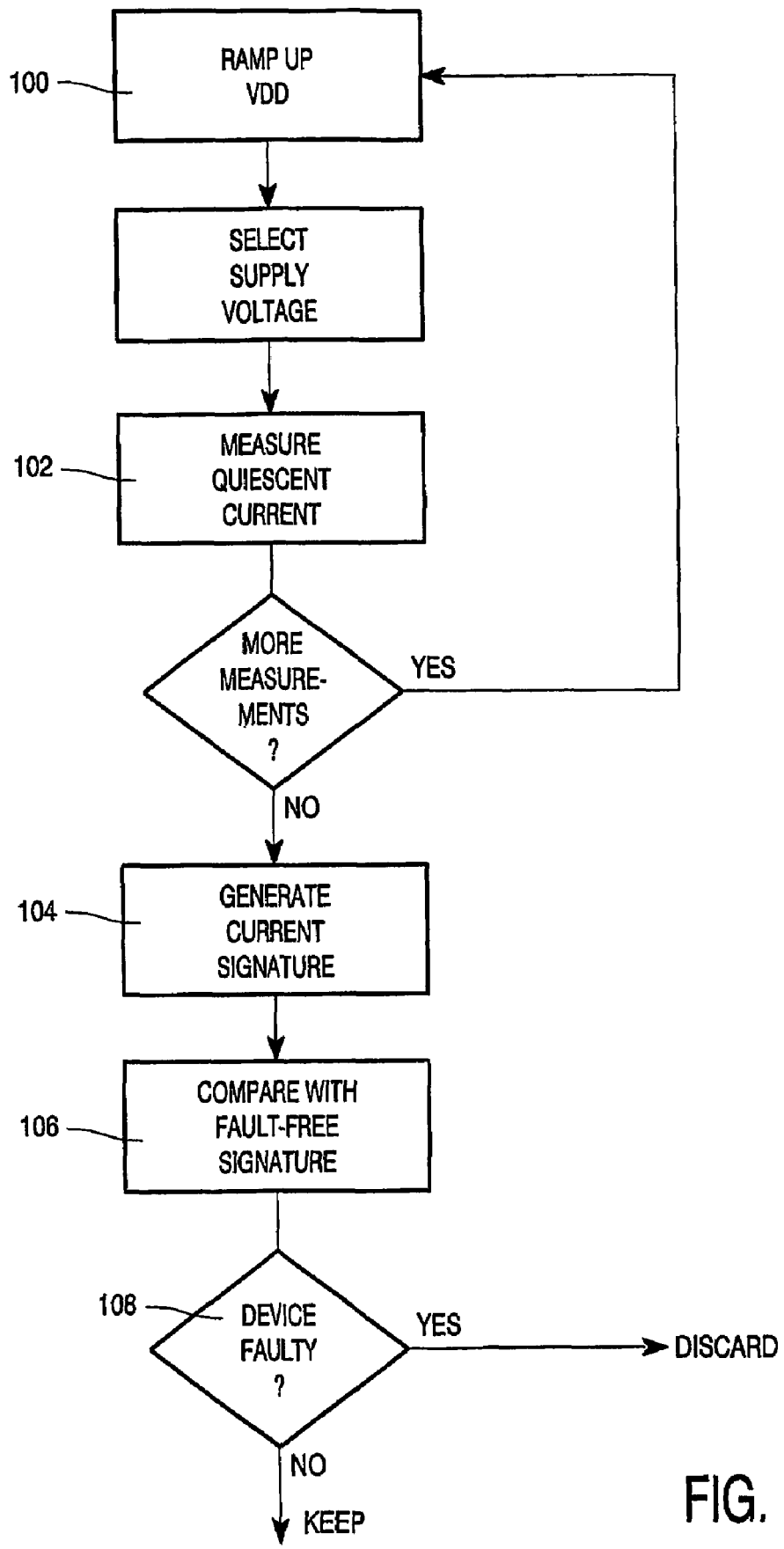
FIG. 4 is a schematic flow diagram illustrating a method of testing an RF circuit according to an exemplary embodiment of the present invention.

Referring to FIG. 4 of the drawings, the power supply $V_{DD}$ is ramped up (step 100) and quiescent current measurements are taken at selected values of $V_{DD}$ (step 102) to generate a current signature (step 104), as illustrated in FIG. 2 of the drawings.

When the power supply is ramped up, all transistors in the circuit pass through several regions of operation, e.g. subthreshold (region A), linear (region B), and saturation (region C). The advantage of transition from region to region is that defects can be detected with distinct accuracy in each of the operating regions. For example, a bridge drains a distinct current depending upon whether the transistors are saturated or in the linear region. Thus, the method of the present invention provides multiple observation points. It is relatively simple, and it is not a functional test such that it can be easily implemented in any tester. Further, the method of the present invention provides distinct fault observability for each power supply voltage at which quiescent current measurements are taken.

Once the current signature has been generated it can be compared with the current signature of a fault-free device (step 106), to determine (step 108) if the device is operating correctly, and if not, it is discarded. For example, the typical current signature of the analogue circuit illustrated in FIG. 1 follows a tanh function, thus it can be expected that a defective device will present an abnormal current signature, i.e. a signature that deviates from the golden tanh form. Hence, a simple pass/fail test procedure can be put in place by comparing signatures. If fault diagnosis is desired, a fault dictionary database can be built and then the tested current signatures can be matched against signatures in this database.

Figure 3:
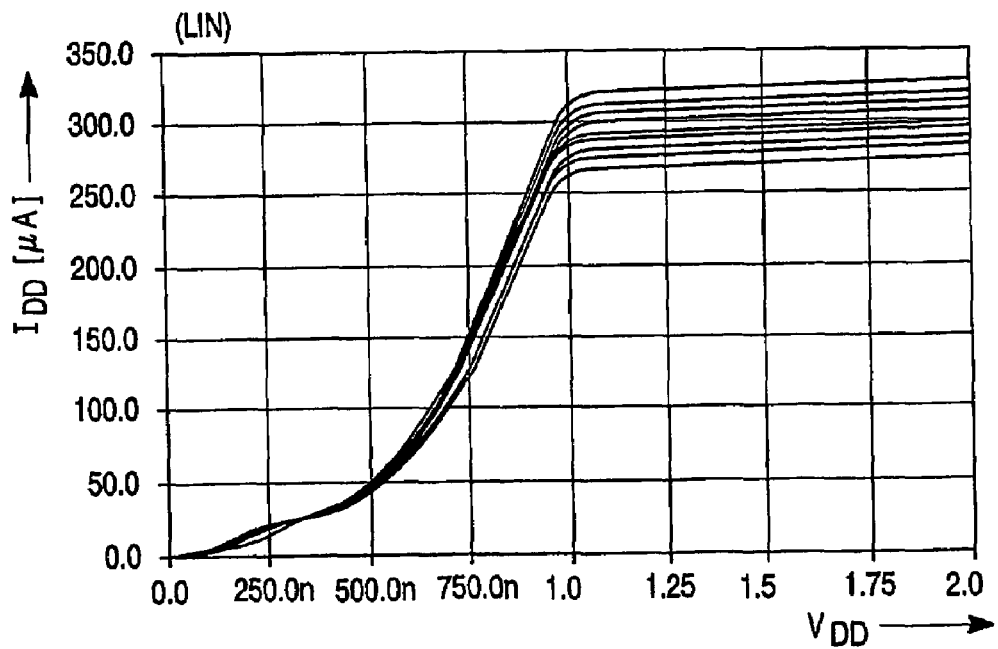
FIG. 3 is a schematic graphical representation of typical low noise amplifier current signatures with process spread.

FIG. 3 illustrates graphically the low noise amplifier's simulated current signature against the power supply voltage sweep taking into account statistical process variations. The statistical process variations account for inter and intra die variations. Since structural testing assumes that the circuit is properly designed and that it can sustain process variations, it is possible to apply a tolerance window or band for the current signature. In other words, any tested signature that falls within this band implies that the circuit is operating correctly, thereby enabling process shifts to be taken into account.

Figure 5:
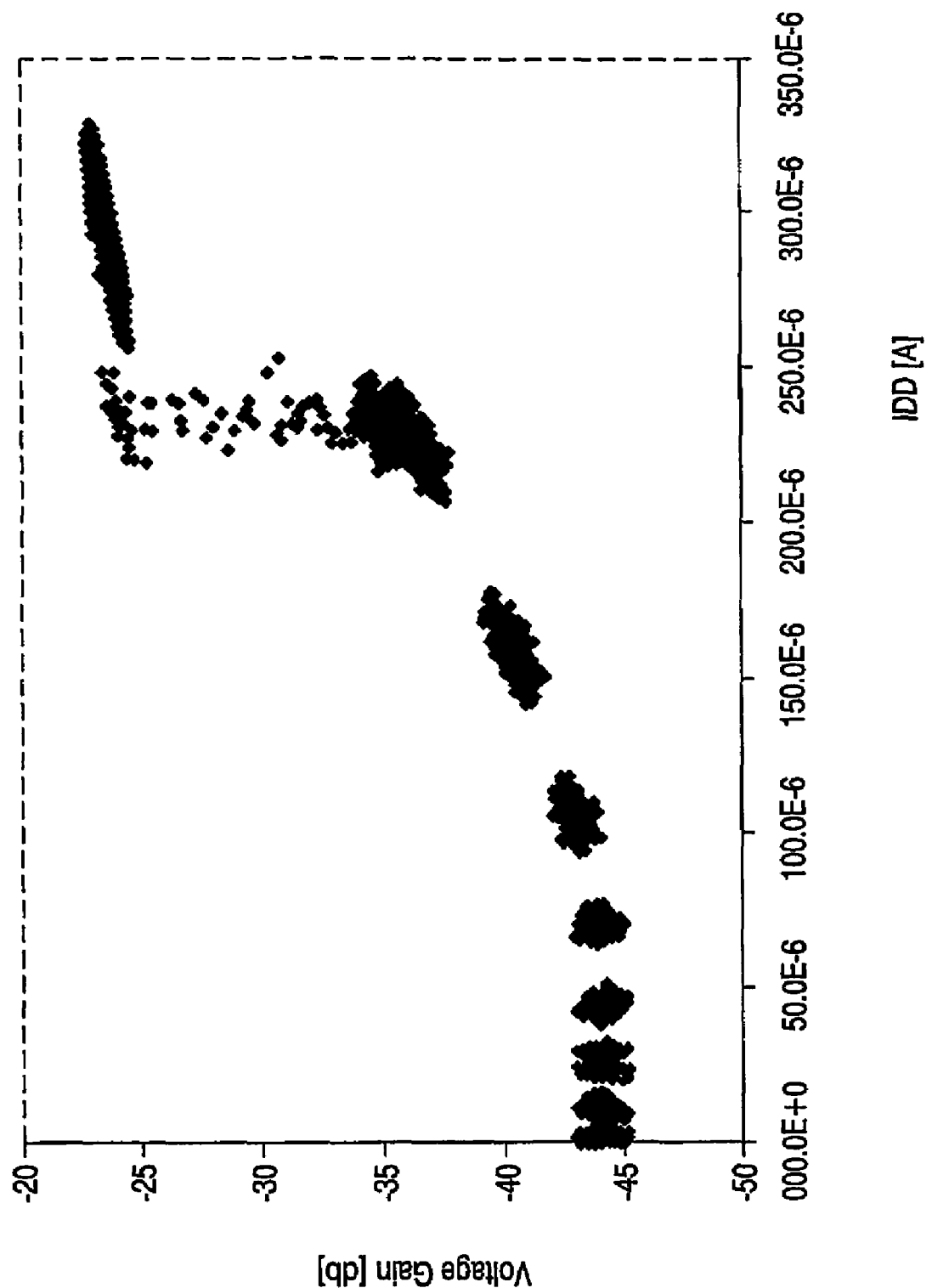
FIG. 5 illustrates the correlation of IDDQ against Gain for various power supply voltages.

FIG. 5 shows a correlation of quiescent current against voltage gain for various power supply values, which is useful to illustrate the limits of the $I_{DD}$ tolerance window at each supply value. Thus, the method of the present invention can also be used to capture parametric faults that could be outside the window or close to its edges using this correlation figure.

In addition, the voltage at one or more selected nodes of a circuit or device may be monitored at each selected power supply, for enhanced fault coverage. For example, referring to the exemplary circuit illustrated in FIG. 1, the method may include the step of measuring the dc voltage at the outputs of the low noise amplifier. According to target specifications, these nodes have to keep a common output voltage level at, for example, 0.8V. The injection of a fault (bridge) will thus increase or decrease this value on one or both nodes.

An embodiment of the present invention has been described above by way of example only, and it will be apparent to a person skilled in the art that modifications and variations can be made to the described embodiment without departing from the scope of the invention as defined by the appended claims. It will be understood that the term "comprising" does not exclude other elements or steps, "a" or "an" does not exclude a plurality, and a single processor or other unit may fulfill the functions of several means recited in the claims.

The invention claimed is:

1. A method of testing analogue or radio frequency circuitry for the presence of faults, the method comprising the steps of:
   a) ramping up a power supply being supplied to a circuit or component under test to apply a plurality of different DC power supply voltages to the circuit or component under test, at least one of said power supply voltages being arranged to cause at least some of the elements of the circuit or component under test to operate in a predetermined region of operation; and
   b) measuring the quiescent current of said circuit or component after application of each of said power supply voltages to generate a current signature representative of the operation of said circuit or component;
   the method being characterized in that said power supply voltages at which said quiescent current measurements are taken comprise selected distinct voltages; and by the step of:
   c) comparing said generated current signature with a predetermined current signature representative of operation of a fault-free component or circuit so as to determine whether or not any faults are present in the component or circuit under test.

2. A method according to claim 1, including the further step of measuring one or more selected nodal voltages, in addition to said quiescent current, as a result of application of said selected power supply voltages.

3. A method according to claim 2, wherein said one or more nodal voltages are measured at one or more respective output nodes of said circuitry.

4. A method according to claim 1, wherein a tolerance window is defined for the resultant quiescent current measurements for at least one of the selected power supply voltages.

5. A method according to claim 4, wherein a tolerance window is defined for the resultant quiescent current measurements for all of the selected power supply voltages.

6. A method according to claim 1, wherein the selected power supply voltages are selected so as to cause at least some of the elements of the circuitry under test to pass through several regions of operation.

7. A method according to claim 1, wherein a fault dictionary database is provided, and the method includes the further step of comparing a generated current signature with contents of such a database to diagnose one or more faults present in the circuitry under test.

8. A record carrier on which is stored a computer program for enabling the method of claim 1 to be performed.

9. A method of testing analogue or radio frequency circuitry, including the step of making available for downloading a computer program for enabling the method of claim 1 to be performed.

10. A method according to claim 1, wherein the different DC power supply voltages are selected to cause at least some of the elements of the circuit or component under test to pass through subthreshold, linear and saturation operating regions.

11. Apparatus for testing analogue or radio frequency circuitry for the presence of faults, the apparatus comprising:
   a) means for ramping up a power supply being supplied to a circuit or component under test to apply a plurality of different DC power supply voltages to the circuit or component under test, at least one of said power supply voltages being arranged to cause at least some of the elements of the circuit or component under test to operate in a predetermined region of operation; and
   b) means for measuring the quiescent current of said circuit or component after application of each of said power supply voltages to generate a current signature representative of the operation of said circuit or component;
   the apparatus being characterized in that said power supply voltages comprise selected distinct voltages; and by:
   c) means for comparing said generated current signature with a predetermined current signature representative of operation of a fault-free component or circuit so as to determine whether or not any faults are present in the component or circuit under test.

* * * * *